United States Patent [19]
Dayton et al.

[11] Patent Number: 6,038,138
[45] Date of Patent: Mar. 14, 2000

[54] CONNECTION ARRANGEMENT FOR ELECTRONIC EQUIPMENT TO PROVIDE FUNCTIONAL EXPANSION IN AT LEAST ONE DIMENSION

[75] Inventors: Birney D. Dayton; Charles S. Meyer, both of Nevada City, Calif.

[73] Assignee: Nvision, Inc., Grass Valley, Calif.

[21] Appl. No.: 09/025,423

[22] Filed: Feb. 18, 1998

[51] Int. Cl.[7] .................................................. H05R 7/14
[52] U.S. Cl. ......................... 361/796; 361/727; 361/752; 361/753; 361/784; 361/788; 361/796; 361/818; 439/61
[58] Field of Search .................................... 361/784–785, 361/788–790, 796–798, 801–803, 724–727; 439/61, 364, 377

[56] References Cited

U.S. PATENT DOCUMENTS

| | | | |
|---|---|---|---|
| 5,205,753 | 4/1993 | Butterfield et al. | |
| 5,315,488 | 5/1994 | Le Gallo et al. | 361/796 |
| 5,949,656 | 9/1999 | Pinault | 361/788 |

*Primary Examiner*—Leo P. Picard
*Assistant Examiner*—Tuan Dinh
*Attorney, Agent, or Firm*—Smith-Hill and Bedell

[57] ABSTRACT

A mother board is mounted in an electrical equipment frame and has the receptacle of a first connector attached thereto at one face. The plug of the first connector is attached to a daughter board at an interconnect edge so that the first connector can be engaged by movement of the daughter board toward the mother board along an axis perpendicular to the interconnect edge of the daughter board and to the face of the mother board. A mezzanine assembly is attached to the daughter board and includes a mezzanine board in spaced parallel relationship with the daughter board and having an edge which is substantially parallel to the interconnect edge of the daughter board and at which the receptacle of a second connector is attached to the mezzanine board. An interconnect board is mounted in the frame and has an edge at which the plug of the second connector is attached to the interconnect board. The interconnect board is oriented with the plug of the second connector parallel to the receptacle of the first connector and away from the mother board. The second connector is engaged substantially simultaneously with the first connector.

18 Claims, 3 Drawing Sheets

CONNECTION ARRANGEMENT FOR ELECTRONIC EQUIPMENT TO PROVIDE FUNCTIONAL EXPANSION IN AT LEAST ONE DIMENSION

BACKGROUND OF THE INVENTION

This invention relates to a connection arrangement for electronic equipment to provide functional expansion in at least one dimension.

Electronic equipment is frequently constructed in modular fashion in a rack on the basis of standard rack units, which are 21 inches (53.34 cm) wide and 1.75 inches (4.45 cm) high. A given rack might accommodate multiple modules stacked one above the other. A module typically includes a vertically disposed mother board carrying multiple vertically disposed edge connectors into each of which a vertically disposed daughter board can be plugged in perpendicular relationship with the mother board. In some types of equipment the daughter boards are all identical and each daughter board can be characterized as having a capacity n in a first dimension, which may be arbitrarily labeled the X dimension, and a capacity m in a second, or Y, dimension. Each module contains the same number N of daughter boards.

The capacity of the equipment in the X dimension is determined by the capacity of the daughter boards in the X dimension and the number of daughter boards in each module and is typically n*N. The capacity of the equipment in the Y dimension is determined by the capacity of the daughter boards and the number of modules in the equipment and if there are M modules, the capacity is typically m*M.

In electronic equipment that can be characterized in this manner as having capacity in two orthogonal dimensions, it may be desirable to have the ability to expand the equipment in one or both dimensions. Expansion in the X dimension can be accommodated by adding a daughter board to each module, increasing the capacity to n*(N+1) whereas expansion in the Y dimension to m*(M+1) can be accommodated by adding a module including N daughter boards.

When equipment of this nature is expanded in the Y dimension, it may be necessary to connect each daughter board of the added module to the corresponding daughter board of at least one adjacent module; and when the equipment is expanded in the X dimension, it may be necessary for each daughter board that is added to a module to be connected to the corresponding daughter board that is added to at least one adjacent module. It may also be necessary to disconnect the daughter board of one module from the corresponding daughter board of an adjacent module when the daughter board is removed, for example for replacement.

In an arrangement disclosed in U.S. Pat. No. 5,205,753 (Butterfield et al), connection or disconnection of corresponding daughter boards is accomplished by use of a cam mechanism which can be actuated when a daughter board is inserted into the module. By actuation of the cam mechanism, a female connector part carried by the daughter board is displaced vertically and engages a complementary male connector part of the corresponding daughter board in an adjacent module.

The circuit board structure shown in Butterfield et al is subject to disadvantage because it employs several moving parts and is therefore rather expensive to manufacture to the standard necessary for trouble-free operation.

It is conventional to locate a circuit board in a mounting structure by reference to routed edges of the board. However, routing of circuit board edges is not a high precision operation and an error in routing can result in an error in positioning of the board relative to its mounting structure. Conversely, it is possible to drill holes in a workpiece at precisely controlled relative positions.

SUMMARY OF THE INVENTION

In accordance with a first aspect of the invention there is provided electrical equipment comprising a frame, a first connector having first and second interengageable parts, a second connector having first and second interengageable parts, a mother board mounted in the frame and having the first part of the first connector attached thereto at a face thereof and oriented away from said face, a daughter board having an edge at which the second part of the first connector is attached to the daughter board, whereby the first and second parts of the first connector can be brought into engagement by movement of the daughter board toward said face of the mother board along an axis perpendicular to said edge of the daughter board and to said face of the mother board, a mezzanine assembly attached to the daughter board, the mezzanine assembly including a mezzanine board in spaced parallel relationship with the daughter board and having an edge which is substantially parallel to said edge of the daughter board and at which the first part of the second connector is attached to the mezzanine board, and an interconnect board mounted in the frame and having an edge at which the second part of the second connector is attached to the interconnect board, the interconnect board being oriented with the second part of the second connector parallel to the first part of the first connector and away from the mother board, whereby substantially simultaneously with bringing the first and second parts of the first connector into engagement, the first and second parts of the second connector are brought into engagement.

In accordance with a second aspect of the invention there is provided electrical equipment comprising a frame, a first connector having first and second interengageable parts, a second connector having first and second interengageable parts, a third connector having first and second interengageable parts, a mother board mounted in the frame and having the first part of the first connector attached thereto at a face thereof and oriented away from said face, a daughter board having a mother board interconnect edge at which the second part of the first connector is attached to the daughter board, whereby the first and second parts of the first connector can be brought into engagement by movement of the daughter board toward said face of the mother board along an axis perpendicular to said mother board interconnect edge and to said face of the mother board, and the daughter board also having first and second daughter board interconnect edges extending substantially perpendicular to the mother board interconnect edge, a first mezzanine assembly attached to the daughter board adjacent the first daughter board interconnect edge thereof, the first mezzanine assembly including a mezzanine board in spaced parallel relationship with the daughter board and having an edge which is substantially parallel to said mother board interconnect edge and at which the first part of the second connector is attached to the mezzanine board, a second mezzanine assembly attached to the daughter board adjacent the second daughter board interconnect edge thereof, the second mezzanine assembly including a mezzanine board in spaced parallel relationship with the daughter board and having an edge which is substantially parallel to said mother board interconnect edge and at which the first part of the third connector is attached to the mezzanine board of the second mezzanine assembly, a first interconnect board mounted in the frame and having an edge at which the second part of the second connector is attached to the first interconnect board, the first interconnect board being oriented with the second part of the second connector parallel to the first part of the first connector and away from the mother board, and a second interconnect board mounted in the frame and having an edge at which the second part of the third connector is attached to the second interconnect board, the second interconnect board being oriented with the second part of the third connector parallel to the first part of the first connector and away from the mother board, whereby simultaneously with bringing the first and second parts of the first connector into engagement, the first and second parts of the second connector and the first and second parts of the third connector are brought into engagement.

In accordance with a third aspect of the invention there is provided electrical equipment comprising a mounting rack, a first module mounted in the rack, the first module having a wall which is formed with a passthrough opening, a second module mounted in the rack, the second module having a wall which is formed with a passthrough opening and is in confronting parallel relationship with the wall of the first module, a first mounting block attached to the wall of the first module and extending away from the second module, a second mounting block attached to the wall of the second module and extending away from the first module, a passthrough board extending through the passthrough openings in the walls of the first and second modules and having a first end in the first module and a second end in the second module, the passthrough board being attached to the first mounting block, and a locating element engaging the first and second mounting blocks and holding them at a fixed spacing in a direction perpendicular to the walls of the first and second modules, whereby the location of the second end of the passthrough board relative to the second mounting block is related to the location of the first end of the passthrough board relative to the first mounting block and the relative locations of the first and second mounting blocks.

In accordance with a third aspect of the invention there is provided electrical equipment comprising a mounting rack, a first module mounted in the rack, the first module having a wall which is formed with an opening, a second module mounted in the rack, the second module having a wall which is formed with an opening and is in confronting parallel relationship with the wall of the first module at a fixed spacing therefrom, a resilient conductive gasket in a state of compression in the space between said walls and contacting the wall of the first module over substantially the entire length of a closed path surrounding the opening in the wall of the first module and contacting the wall of the second module over substantially the entire length of a closed path surrounding the opening in the wall of the second module.

In accordance with a fifth aspect of the invention there is provided an electrical equipment module including a frame having first and second spaced parallel walls, first and second mounting blocks attached to the first and second walls respectively, and a locating element engaging the first and second mounting blocks and holding them at a fixed spacing in a direction perpendicular to the first and second walls, the locating element including a bar having first and second parallel rods projecting therefrom and fitted in bores of the first and second mounting blocks respectively.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
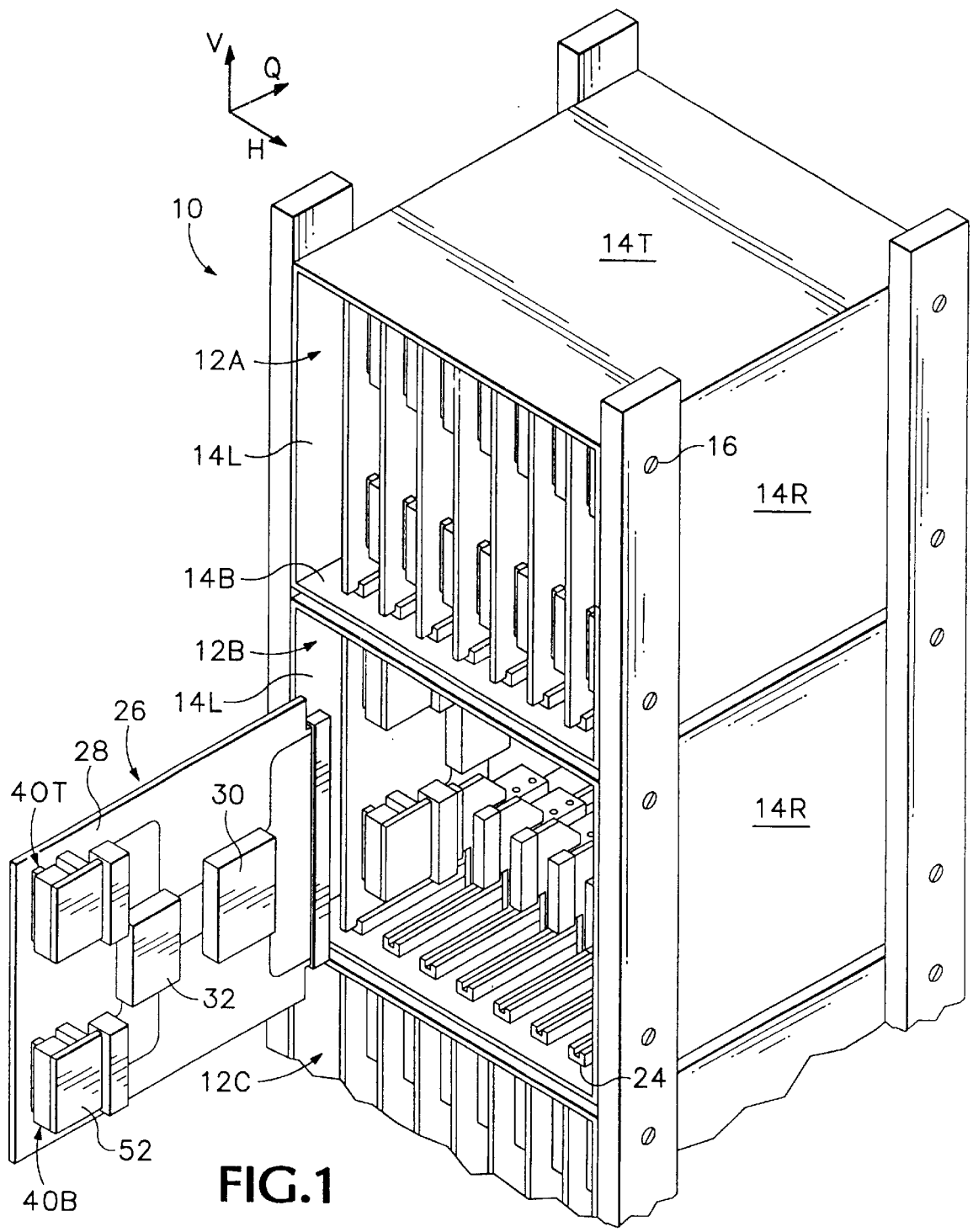
FIG. 1 is a partial perspective view illustrating electrical equipment in accordance with the present invention.
Figure 2:
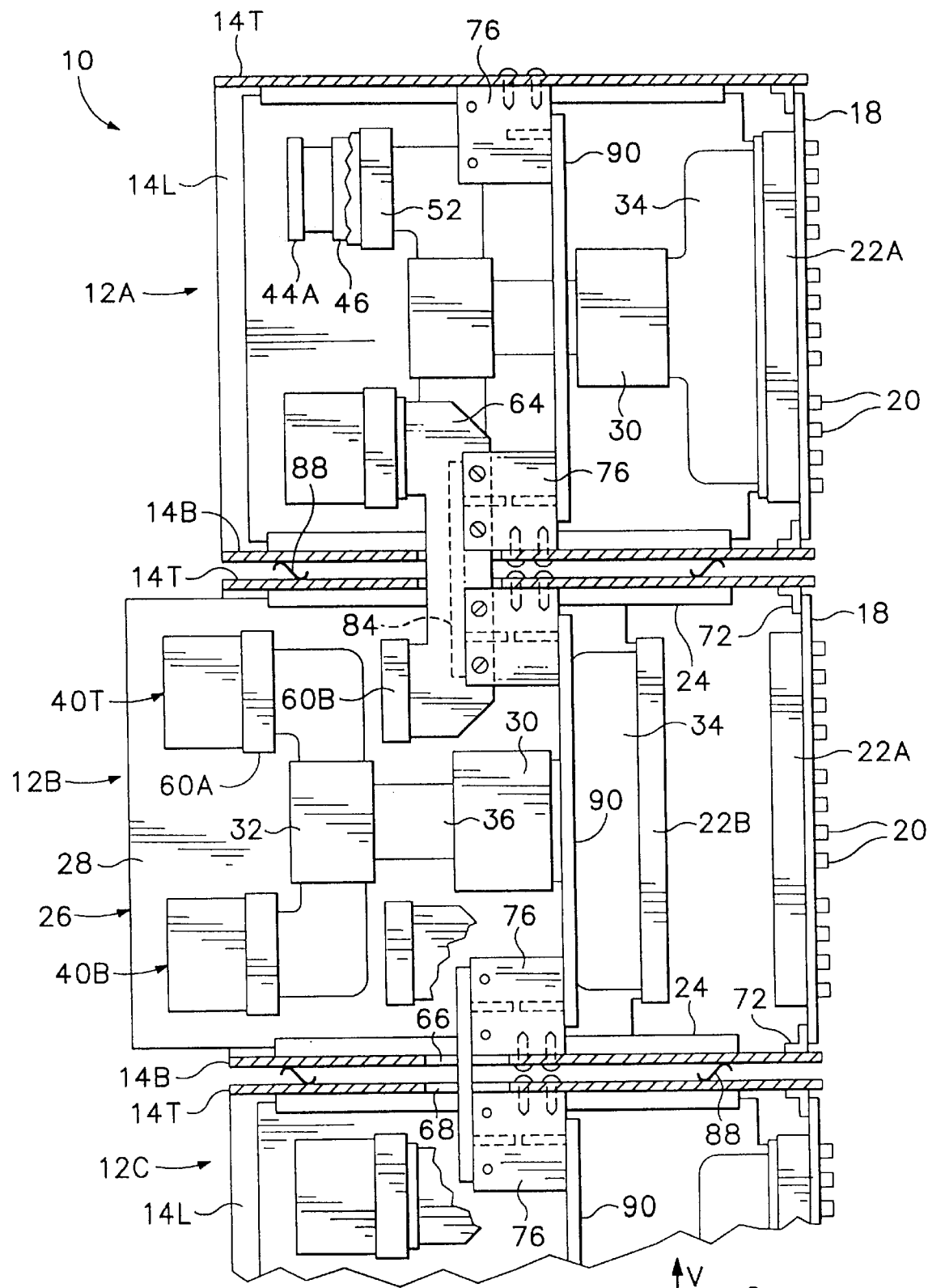
FIG. 2 is a sectional view of the equipment shown in FIG. 1.

The equipment shown in the drawings includes three electronic equipment modules 12A, 12B and 12C stacked one on top of the other in a rack 10 which defines three axes, designated V, H and Q, with the center module 12B between the top module 12A and the bottom module 12C. Each module includes a frame composed of left and right side walls 14L and 14R and top and bottom walls 14T and 14B, all made of sheet metal. The frames are held against vertical movement relative to the rack, as shown schematically by screws 16. At the left of FIG. 2, the walls 14 define a rectangular front opening of the frame and at the right of FIG. 2, the walls 14 define a rectangular back opening.

Figure 3:
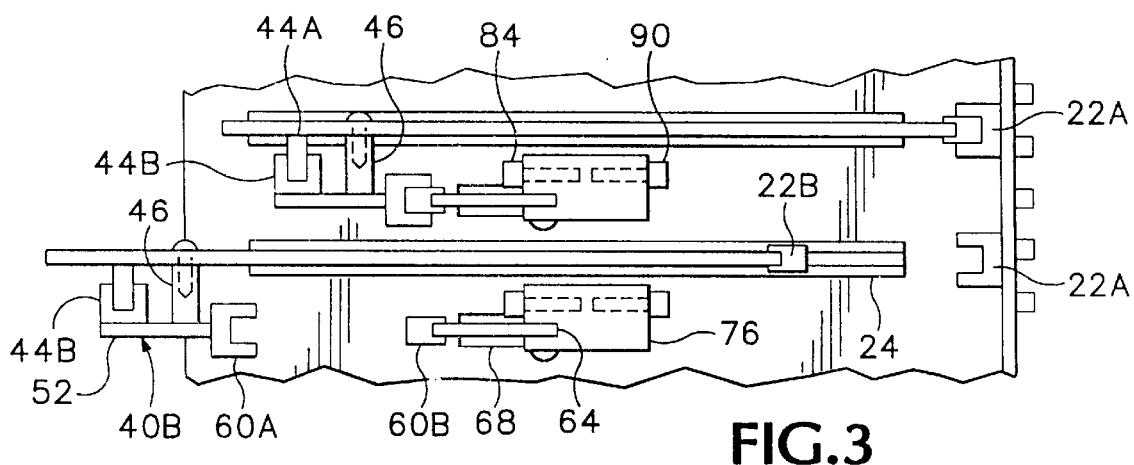
FIG. 3 is a sectional view taken on the line III—III of FIG. 2.
Figure 4:
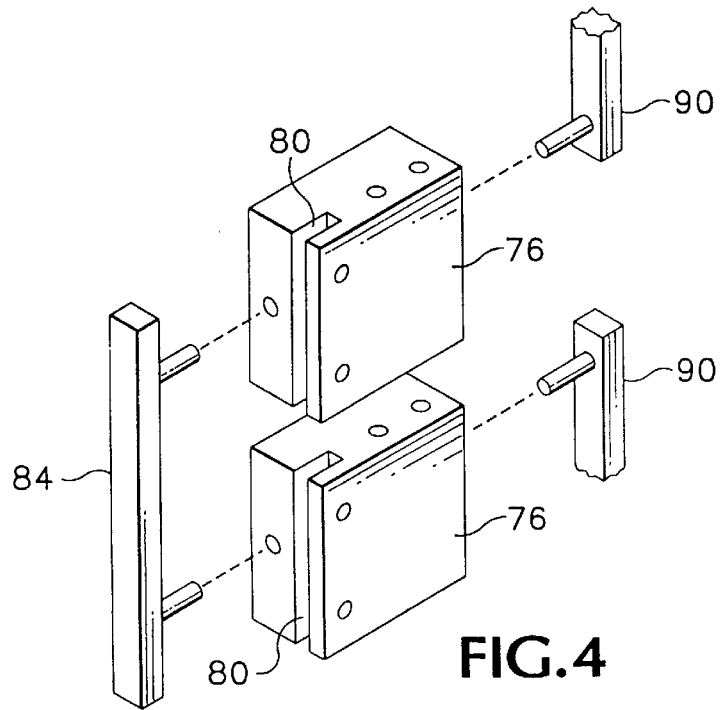
FIG. 4 is a perspective view of a component of the equipment.

A mother board 18 is mounted in the frame so that it is perpendicular to the Q-axis and its two opposite surfaces are accessible through the front and back openings respectively. On its back surface, the mother board is provided with multiple connector sockets 20, such as BNC connector sockets, for connection to respective signal sources and on its front surface the mother board has multiple vertically disposed connector receptacles 22A, two of which are illustrated in FIG. 3, each defining a narrow linear slot for receiving a corresponding narrow linear plug 22B. The mother board 18 includes a bus structure (not shown) which distributes the signals received at the connector sockets 20 to the receptacles 22A. Each of the signals supplied to the rear connector sockets 20 is accessible at each of the connector receptacles 22A.

Although the interior space of each frame is not divided by walls, it is convenient to regard this space as being composed of multiple vertically disposed cells. The cells of an upper frame are vertically aligned with the cells of a lower frame. Each cell is dimensioned to accommodate a single daughter board structure 26, including a daughter board 28. Within each cell, each frame is provided with a pair of upper and lower guide channels 24 for guiding insertion of a vertically disposed daughter board 28 into the cell along the Q-axis. Each pair of guide channels 24 is aligned with one of the connector receptacles 22A and defines a daughter board plane which is perpendicular to the H-axis and is parallel to the daughter board planes of the other cells of the module and is vertically aligned with a daughter board plane of a vertically adjacent cell.

The daughter board structures are identical and each includes a daughter board 28 which is provided at its rear edge (the leading edge when the daughter board structure is inserted into the frame via the front opening) with a connector plug 22B for engaging a receptacle 22A of the mother board. Each connector 22A/22B has 64 signal pins. It will be understood that the connector 22A/22B also has suitable ground pins. However, facilities for ground connection will not be alluded to further herein, since the need for such facilities is well understood by those skilled in the art and discussion of such facilities is not required for an understanding of the invention.

Each daughter board carries a primary functional circuit 30 and a secondary circuit 32. The primary functional circuit 30 has 64 signal input pins to which the signal pins of the connector 22A/22B are respectively connected by conductor runs 34. The primary functional circuit 30 has 16 signal output pins connected by conductor runs 36 to respective signal input pins of the secondary circuit 32. The secondary circuit 32 also has 16 input expansion pins and 16 output pins.

The daughter board structure 26 includes two mezzanine assemblies 40T and 40B near the top and bottom edges respectively of the daughter board 28. Each mezzanine assembly 40 projects from the daughter board toward the right wall 14R of the frame and includes a stand-off 46 which is attached to the daughter board 28 by screws and a mezzanine board 52 which is attached to the stand-off by screws. The mezzanine board is thereby held in spaced parallel relationship with the daughter board 28. The mezzanine assembly also includes a connector plug 44A which is attached to the daughter board and a connector receptacle 44B which is attached to the mezzanine board 52. The plug 44A is engaged with the receptacle 44B.

The mezzanine board 52 projects from the connector 44A/44B toward the rear edge of the daughter board 28 and has a free edge at which it carries a connector receptacle 60A. The receptacle 60A defines a narrow linear slot for receiving a corresponding narrow linear plug 60B.

Corresponding cells of each two vertically adjacent frames, e.g. 12A and 12B, are linked by a passthrough board 64 which extends partially within each cell. The passthrough board 64 is generally U-shaped with one limb of the U extending horizontally in the upper frame 12A toward the front opening of the frame and the other limb of the U extending horizontally in the lower frame 12B toward the front opening of the frame. The free end of each limb of the passthrough board carries a plug 60B, and the two plugs 60B of the passthrough board are aligned. The base of the U passes through an opening 66 in the bottom wall 14B of the upper frame and a corresponding opening 68 in the top wall 14T of the lower frame.

When a daughter board structure 26 is inserted in the guide channels 24 of a selected cell, the connector receptacles 60A of the top and bottom mezzanine assemblies 40T and 40B of the daughter board structure are aligned with the lower and upper connector plugs 60B of the two passthrough boards that extend into the selected cell, from the cells that are respectively above and below the selected cell, and when the daughter board structure 26 is displaced to the rear of the selected cell, and the connector plug 22B engages the connector receptacle 22A of the mother board 18, the connector receptacles 60A of the top and bottom mezzanine assemblies simultaneously engage the connector plugs 60B of the two passthrough boards. The stand-off 46 relieves stress on the mezzanine connector 44A/44B when the receptacle 60A engages the plug 60B.

The mezzanine connectors 44A/44B each have 16 signal pins. The pins of the mezzanine connector of the top mezzanine assembly 40T of the daughter board structure in the selected cell are connected by conductor runs of the daughter board to respective input expansion pins of the secondary circuit 32, and the output pins of the secondary circuit are connected by conductor runs of the daughter board to the pins of the mezzanine connector of the bottom mezzanine assembly 40B. The pins of the mezzanine connector of the bottom mezzanine assembly 40B are connected through conductor runs of the mezzanine board and the connector 60A/60B to conductor runs of the passthrough board that extends from the selected cell into the cell below the selected cell, and hence to the input expansion pins of the secondary circuit of the next lower daughter board.

It will therefore be seen that when the daughter board structure is inserted in the selected cell, the daughter board in the selected cell is connected not only to the mother board but also to the corresponding daughter boards in the cells above and below the selected cell. The connection arrangement described above allows a daughter board that is added to a frame to be connected to the corresponding daughter board in at least one vertically adjacent frame without need for a cam mechanism or other parts that move relative to the daughter board.

In order to implement the connection arrangement described above, it is necessary that the plugs 60B and the receptacle 22A in the selected cell be in precisely controlled relative positions and orientations, related to the relative positions and orientations of the receptacles 60A and the plug 22B of the daughter board structure.

The relative positions and orientations of the receptacles 60A and the plug 22B can be controlled to a high degree of precision in fabrication of the daughter board structure, so that the linear slots defined by the receptacles 60A of the two mezzanine assemblies respectively are aligned with each other and are parallel to the plug 22B.

The mother board is mounted in the frame by attachment to mounting angles 72 which are attached to the top and bottom walls of the frame by screws threaded through holes drilled in the wall 14B and 14T and in the mounting angle itself and similarly the passthrough board is positioned relative to two vertically adjacent frames by mounting blocks 76 which are attached to the top and bottom walls of the frames respectively by screws threaded through holes drilled in the walls and in the mounting blocks themselves.

The mounting angles 72 and the mounting blocks 76 are made of metal and can be fabricated to tight tolerances. Further, holes can be drilled in the mounting angles and the mounting blocks at locations that are precisely defined relative to other features of the respective elements, and the relative positions of drilled holes in the circuit boards and in the walls 14T and 14B of the frame can be controlled to tight tolerances. These capabilities make it possible to attach the mounting angles to the walls 14T and 14B so that the general plane of the mother board is perpendicular to the Q-axis and the position of the mother board along the Q-axis relative to the holes for attaching the mounting blocks is controlled to a high degree of precision, and it can be ensured to a high degree of precision that the connector receptacles 22A are parallel to the V-axis and are accurately positioned along the V-axis relative to the walls 14T and 14B and are accurately positioned along the H-axis relative to the holes for attaching the mounting blocks to the walls 14T and 14B.

The mounting blocks 76 are formed with slots 80 for receiving the rear edge of the passthrough board 64 and defining the orientation of the passthrough board relative to the faces of the mounting blocks. Since the mounting blocks are attached to the walls 14T and 14B by screws, the locations of the mounting blocks relative to other features of the walls 14T and 14B can be precisely controlled, and therefore the passthrough board can be positioned with a high degree of precision in a plane that is perpendicular to the plane of the mother board.

The passthrough board 64 is attached to the lower mounting block by two screws. Therefore, the position and orientation of each plug 60B relative to the lower mounting block is precisely controlled.

Each mounting block 76 is formed with a through-hole 82 opening at its front and back surfaces. A first Π-shaped metal key 84 has two cylindrical rods projecting from a relatively short bar. The bar of the key 84 extends through the openings 66 and 68 in the confronting walls 14B and 14T of two vertically adjacent frames and the rods are inserted in the holes 82 of the two mounting blocks attached to the two walls 14B and 14T respectively. The key 84 holds the two mounting blocks at a precisely controlled spacing. Constraints applied to the mounting blocks by virtue of their being attached to the walls of the frame ensure that the two mounting blocks are at controlled relative positions. The position of the upper connector plug of the passthrough card relative to the upper mounting block is therefore accurately controlled.

The mechanisms described above ensure to a high degree of precision that the connector plugs 60B of the two passthrough boards that extend into the selected cell are aligned and are parallel to the slot defined by the receptacle 22A of the selected cell. Further, the interconnect plane of the mother board and the daughter board structure and the interconnect plane of the mezzanine board and passthrough board are parallel and are at a precisely controlled distance and the connector engagement axes are parallel. Therefore, all three connectors engage simultaneously when the daughter board structure is inserted in the selected cell.

By using the key 84 to define the relative positions of the mounting blocks, accumulation of vertical errors is eliminated.

The key 84 also prevents relative deflection of the confronting top and bottom walls 14T and 14B of two vertically adjacent frames and thereby establishes the maximum spacing between the walls 14B and 14T of two vertically adjacent frames. Consequently, a conductive gasket 88, which is placed between the confronting wall around the holes 66 and 68 to limit electro-magnetic interference, is held in compression and is in electrically conductive contact with the walls 14B and 14T.

It is necessary to maintain the top and bottom walls 14T and 14B of each frame at the proper spacing in order to ensure that the connector plugs 60B of the two passthrough boards that extend into the selected call are at the same spacing as the receptacles 60H of the daughter board structure that is to be installed in the selected call. FIBS. 2 and 3 illustrate for this purpose a second Π-shaped metal key 90 which is similar to the key 84 except that the bar from which the two cylindrical rods project is longer. The rods of the key 90 are inserted in the holes 82 of the two mounting blocks 76 in a single cell from the rear of the cell. Together, the keys 84 and 90 ensure to a high degree of precision that the top and bottom walls 14T and 14B of all frames are at the proper respective heights within the rack 10.

A key 90 may be provided in each cell of a frame or keys may be provided in fewer cells, so long as the top and bottom walls of the frame are held at a uniform spacing.

It will be seen that the top wall 14T of the top module 12A is provided with a mounting block 76 even though the drawings do not illustrate a passthrough board extending into the module 12A through its top wall 14T. This is in order to allow the top module 12A to accommodate the key 90.

Preferably, the connectors 22A/22B, 44A/44B and 60A/60B are the surface mount connectors sold by AMP Incorporated under the designation MICTOR. This type of connector, which provides a high linear density of signal lines and requires only a small insertion force, is available in several styles, including a coplanar style (suitable for the connector 60A/60B), styles for connecting two parallel, non-coplanar boards (connector 44A/44B) and styles for connecting perpendicular boards (connector 22A/22B).

It will be appreciated that the invention is not restricted to the particular embodiment that has been described, and that variations may be made therein without departing from the scope of the invention as defined in the appended claims and equivalents thereof. For example, the invention is not restricted to use of the metal mounting blocks 76 for positioning the passthrough board, and the other mounting elements, such as metal tongues formed in unitary fashion with the bottom wall of the upper module and top wall of the lower module by a bending operation when the openings 66 and 68 are formed in the walls 14B and 14T respectively, may be used instead. The second Π-shaped key 90 provides a convenient mechanism for maintaining the top and bottom walls 14T and 14B at the proper spacing, but other structures, such as struts attached to the top and bottom walls, may be used instead.

We claim:

1. Electrical equipment comprising:

a frame, a first connector having first and second interengageable parts, a second connector having first and second interengageable parts, a mother board mounted in the frame and having the first part of the first connector attached thereto at a face thereof and oriented away from said face, a daughter board having an edge at which the second part of the first connector is attached to the daughter board, whereby the first and second parts of the first connector can be brought into engagement by movement of the daughter board toward said face of the mother board along an axis perpendicular to said edge of the daughter board and to said face of the mother board, a mezzanine assembly attached to the daughter board, the mezzanine assembly including a mezzanine board in spaced parallel relationship with the daughter board and having an edge which is substantially parallel to said edge of the daughter board and at which the first part of the second connector is attached to the mezzanine board, and an interconnect board mounted in the frame and having an edge at which the second part of the second connector is attached to the interconnect board, the interconnect board being oriented with the second part of the second connector parallel to the first part of the first connector and away from the mother board, whereby substantially simultaneously with bringing the first and second parts of the first connector into engagement, the first and second parts of the second connector are brought into engagement.

2. Electrical equipment according to claim 1, wherein the mezzanine assembly includes a third connector having first and second interengageable parts, the first part of the third connector being attached to the daughter board and the second part (44B) of the third connector being attached to the mezzanine board.

3. Electrical equipment according to claim 2, wherein the first and second parts of the third connector are surface mounted to the daughter board and the mezzanine board respectively.

4. Electrical equipment according to claim 1, wherein the first and second parts of the first connector are surface mounted to the mother board and the daughter board respectively.

5. Electrical equipment according to claim 1, wherein the first and second parts of the second connector are surface mounted to the mezzanine board and the interconnect board respectively.

6. Electrical equipment according to claim 1, wherein the interconnect board is substantially parallel to the daughter board.

7. Electrical equipment comprising:

a frame, a first connector having first and second interengageable parts, a second connector having first and second interengageable parts, a third connector having first and second interengageable parts, a mother board mounted in the frame and having the first part of the first connector attached thereto at a face thereof and oriented away from said face, a daughter board having a mother board interconnect edge at which the second part of the first connector is attached to the daughter board, whereby the first and second parts of the first connector can be brought into engagement by movement of the daughter board toward said face of the mother board along an axis perpendicular to said mother board interconnect edge and to said face of the mother board, and the daughter board also having first and second daughter board interconnect edges extending substantially perpendicular to the mother board interconnect edge, a first mezzanine assembly attached to the daughter board adjacent the first daughter board interconnect edge thereof, the first mezzanine assembly including a mezzanine board in spaced parallel relationship with the daughter board and having an edge which is substantially parallel to said mother board interconnect edge and at which the first part of the second connector is attached to the mezzanine board, a second mezzanine assembly attached to the daughter board adjacent the second daughter board interconnect edge thereof, the second mezzanine assembly including a mezzanine board in spaced parallel relationship with the daughter board and having an edge which is substantially parallel to said mother board interconnect edge and at which the first part of the third connector is attached to the mezzanine board of the second mezzanine assembly, a first interconnect board mounted in the frame and having an edge at which the second part of the second connector is attached to the first interconnect board, the first interconnect board being oriented with the second part of the second connector parallel to the first part of the first connector and away from the mother board, and a second interconnect board mounted in the frame and having an edge at which the second part of the third connector is attached to the second interconnect board, the second interconnect board being oriented with the second part of the third connector parallel to the first part of the first connector and away from the mother board, whereby simultaneously with bringing the first and second parts of the first connector into engagement, the first and second parts of the second connector and the first and second parts of the third connector are brought into engagement.

8. Electrical equipment comprising:

a mounting rack, a first module mounted in the rack, the first module having a wall which is formed with a passthrough opening, a second module mounted in the rack, the second module having a wall which is formed with a passthrough opening and is in confronting parallel relationship with the wall of the first module, a first mounting block attached to the wall of the first module and extending away from the second module, a second mounting block attached to the wall of the second module and extending away from the first module, a passthrough board extending through the passthrough openings in the walls of the first and second modules and having a first end in the first module and a second end in the second module, the passthrough board being attached to the first mounting block, and a locating element engaging the first and second mounting blocks and holding them at a fixed spacing in a direction perpendicular to the walls of the first and second modules, whereby the location of the second end of the passthrough board relative to the second mounting block is related to the location of the first end of the passthrough board relative to the first mounting block and the relative locations of the first and second mounting blocks.

9. Electrical equipment according to claim 8, wherein the first and second mounting blocks are attached to the walls of the first and second modules respectively by fastening elements passing through drilled holes in the respective walls.

10. Electrical equipment according to claim 8, wherein the first mounting block is attached to said wall of the first module by first and second fastening elements passing through respective holes in said wall of the first module, the first and second fastening elements being spaced apart along an axis parallel to the passthrough board.

11. Electrical equipment according to claim 8, wherein the locating element holds the first and second mounting blocks against relative movement along an axis perpendicular to said walls of the first and second modules.

12. Electrical equipment according to claim 8, wherein the walls of the first and second modules are in spaced parallel relationship and the equipment further comprises a conductive gasket in the space between said walls, the conductive gasket being in a state of compression.

13. Electrical equipment according to claim 8, further comprising a mounting element having first and second mutually perpendicular faces, the mounting element being attached to the wall of the first module and extending away from the second module and having its first face confronting and in contact with the wall of the first module, a mother board confronting and in contact with the second face of the mounting element, and at least one fastening element passing through a hole in the mother board and engaging the mounting element, whereby the mother board is attached to the mounting angle.

14. Electrical equipment according to claim 13, wherein the mounting element is attached to the wall of the first module by at least two fastening elements passing through respective drilled holes in said wall and engaging the mounting element, the holes being spaced apart parallel to the second face of the mounting element.

15. Electrical equipment comprising:

a mounting rack, a first module mounted in the rack, the first module having a wall which is formed with an opening, a second module mounted in the rack, the second module having a wall which is formed with an opening and is in confronting parallel relationship with the wall of the first module at a fixed spacing therefrom, a resilient conductive gasket in a state of compression in the space between said walls and contacting the wall of the first module over substantially the entire length of a closed path surrounding the opening in the wall of the first module and contacting the wall of the second module over substantially the entire length of a closed path surrounding the opening in the wall of the second module.

16. Electrical equipment according to claim 15, comprising:

a first mounting block attached to the wall of the first module and extending away from the second module, a second mounting block attached to the wall of the second module and extending away from the first module, a locating element engaging the first and second mounting blocks and holding them at a fixed spacing in a direction perpendicular to the walls of the first and second modules.

17. Electrical equipment according to claim 15, further comprising a passthrough board extending through the openings in the walls of the first and second modules and having a first end in the first module and a second end in the second module.

18. An electrical equipment module including a frame having first and second spaced parallel walls, first and second mounting blocks attached to the first and second walls respectively, and a locating element engaging the first and second mounting blocks and holding them at a fixed spacing in a direction perpendicular to the first and second walls, the locating element including a bar having first and second parallel rods projecting therefrom and fitted in bores of the first and second mounting blocks respectively.

* * * * *